(12) United States Patent
McGrath et al.

(10) Patent No.: US 6,767,252 B2
(45) Date of Patent: Jul. 27, 2004

(54) HIGH SPEED DIFFERENTIAL SIGNAL EDGE CARD CONNECTOR AND CIRCUIT BOARD LAYOUTS THEREFOR

(75) Inventors: James L. McGrath, Bloomingdale, IL (US); James P. Capadona, Chicago, IL (US); Daniel B. McGowan, Naperville, IL (US); Augusto P. Panella, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/267,443

(22) Filed: Oct. 9, 2002

(65) Prior Publication Data

US 2003/0123236 A1 Jul. 3, 2003

Related U.S. Application Data

(60) Provisional application No. 60/328,223, filed on Oct. 10, 2001.

(51) Int. Cl.$^7$ .............................................. H01R 23/70
(52) U.S. Cl. ...................... 439/637; 439/608; 439/108
(58) Field of Search ................................ 439/608, 637, 439/108, 607, 60, 636, 630–635, 62–67, 260

(56) References Cited

U.S. PATENT DOCUMENTS

| | | | |
|---|---|---|---|
| 3,399,372 A | | 8/1968 | Uberbacher |
| 3,671,813 A | | 6/1972 | Wilcox |
| 4,385,795 A | | 5/1983 | Endoh et al. |
| 4,846,734 A | | 7/1989 | Lytle |
| 4,869,672 A | | 9/1989 | Andrews |
| 5,051,099 A | * | 9/1991 | Pickles et al. .............. 439/108 |
| 5,277,591 A | | 1/1994 | Felcman |
| 5,425,658 A | | 6/1995 | White |
| 5,659,951 A | | 8/1997 | Gall et al. |
| 5,734,559 A | | 3/1998 | Banerjee et al. |
| 5,865,631 A | | 2/1999 | Berto et al. |
| 5,904,581 A | | 5/1999 | Pope et al. |

(List continued on next page.)

FOREIGN PATENT DOCUMENTS

| | | |
|---|---|---|
| EP | 0 158 876 A2 | 10/1985 |
| EP | 0 859 433 A2 | 8/1998 |
| EP | 0 869 705 A1 | 10/1998 |
| EP | 0 959 535 A1 | 11/1999 |

OTHER PUBLICATIONS

EP Search Report in counterpart PCT application No. PCT/US02/32404.

Primary Examiner—Alex Gilman
(74) Attorney, Agent, or Firm—Thomas D. Paulius

(57) ABSTRACT

A differential signal connector that is used for edge card application has a plurality of differential signal terminals and associated ground terminals arranged in "triplets", i.e., distinct sets of three conductive terminals, each such triplet including a pair of differential signal terminals and one associated ground terminal. The ground terminal is flanked by the two differential signal terminals and each triplet is spaced apart from an adjacent triplet by a spacing which is greater than any single spacing between adjacent terminals within a triplet. Circuit boards to which such a connector is mounted are also disclosed and they have a particular pattern of termination traces, commonly taking the form of plated vias extending through the circuit board. These vias are arranged in a triangular pattern and the ground reference plane of the circuit board is provided with voids, one void being associated and encompassing a pair of the differential signal vias of a single terminal triplet. This reduces the capacitance of the signal vias and thereby increases the impedance of the circuit board within the launch area to lessen impedance discontinuities in the connector-circuit board interface.

29 Claims, 6 Drawing Sheets

U.S. PATENT DOCUMENTS

| | | |
|---|---|---|
| 6,234,807 B1 | 5/2001 | Amini et al. |
| 6,280,209 B1 | 8/2001 | Bassler et al. |
| 6,379,188 B1 | 4/2002 | Cohen et al. |
| 6,394,822 B1 | 5/2002 | McNamara |
| 6,433,286 B1 | 8/2002 | Doberenz |
| 6,454,605 B1 | 9/2002 | Bassler et al. |
| 6,457,983 B1 | 10/2002 | Bassler et al. |
| 6,464,537 B1 * | 10/2002 | Letourneau et al. ........ 439/608 |
| 6,554,647 B1 | 4/2003 | Cohen et al. |
| 6,575,789 B2 | 6/2003 | Bassler et al. |
| 6,589,061 B1 | 7/2003 | Korsunsky et al. |
| 6,590,466 B2 | 7/2003 | Lin et al. |
| 6,607,402 B2 | 8/2003 | Cohen et al. |
| 2002/0180471 A1 | 12/2002 | Cartier |
| 2003/0032316 A1 | 2/2003 | Bassler et al. |

* cited by examiner

HIGH SPEED DIFFERENTIAL SIGNAL EDGE CARD CONNECTOR AND CIRCUIT BOARD LAYOUTS THEREFOR

REFERENCE TO RELATED APPLICATIONS

This application claims priority of U.S. Provisional Patent Application Serial No. 60/328,223, filed Oct. 10, 2001.

BACKGROUND OF THE INVENTION

The present invention generally relates to high speed connectors, and more particularly to a high speed edge card connector incorporating differential signal pair.

Many types of connectors are known in the art. One such type of connector is an "edge card" connector that is used to provide an interconnection between a circuit board and another board that is commonly known in the art as a "daughter board." In order to achieve high density of terminals and provide more connections to more circuits, the terminals are placed close together on small pitches. In instances where the connector is used in high speed applications, crosstalk may occur between the signal terminals, which typically leads to signal error and degradation. It is important to minimize crosstalk in differential signal applications and to regulate the impedance of connectors used in terminating differential signal pairs.

In order to combat crosstalk and reduce signal interference, one solution known in the art is to provide at least one reference ground in close proximity to each signal terminal.

In conventional high speed connector applications, i.e., those capable of operating at 1.0 GHz and above, impedance is controlled by adding more conductive material to terminals, particularly to the ground terminals, in order to regulate the optimal impedance of the particular connector. This type of arrangement, is described in U.S. Pat. No. 5,853,303, issued Dec. 29, 1999, wherein the sizes and shapes of the terminals are manipulated to vary the overall capacitance of the terminals. In these type connectors, as illustrated in the '303 patent, the terminals of the edge card connector are commonly arranged in a signal-ground-signal-ground, etc. (i.e., "S-G-SG", etc.) order so that each and every signal terminal is positioned between two ground terminals.

The equation for determining impedance is generally accepted as $Z\sqrt{L/C}$ where L=inductance, C=capacitance and Z=impedance, and given the preferred GS-G-S-G terminal arrangement stated above, each pair of signal and ground terminals act as a capacitor and thereby generate a capacitance during operation. This capacitance must be considered in determining the overall impedance of the connection. The capacitance for a system requires adding together all of the capacitances of the individual components of the connector system. As the system capacitance increases, the overall impedance of the system will drop. Likewise, as the system capacitance decreases, the overall impedance of the system will increase in that area. Drops in impedance occur along the edge card-connector interface as well as the connector-circuit board interface. It is desirable not to have widely varying rises and drops in the impedance of an edge card connector system, especially at the desirable high transmission speeds targeted for new and future electronic applications, in the order of 3 Gigahertz and greater.

Conventional solutions in the art for edge card connectors address only the decrease of the impedance as a design factor and no art, to applicant's knowledge, seeks to increase the impedance of a connector system, by modifying the structure of the connector itself, in order to maintain the system impedance at the connector interfaces at 100 ohms, within tolerances. U.S. Pat. No. 6,433,286, issued Aug. 13, 2002 describes a means of increasing the impedance on a printed circuit board by forming a plurality of voids in a board ground reference plane and aligning signal traces with the pattern of voids. This is a complex solution and it requires extra expense in the design of the circuit board and mandates that a certain number of voids bu utilized with the circuit board. Additionally, if the signal traces are not aligned with the voids of the ground reference plane, the impedance modifying effects of the board layout will not be easily achieved.

The present invention is therefore directed to a connector system that overcomes the aforementioned disadvantages, both in the structure of the connector itself and in the structure of the circuit board.

SUMMARY OF THE INVENTION

Accordingly, it is a general object of the present invention to provide an improved edge card connector system that delivers a more regulated operational impedance level.

Another object of the present invention is to provide an improved edge card for use with a corresponding connector having a preselected operational impedance range, the edge card having a plurality of conductive traces formed along one edge thereof, the traces being arranged in a "triplet" pattern which includes two differential signal traces and an associated ground trace, each such triplet of traces being separated from other traces on the edge card by an interengaging space so as to spatially and electrically isolate each distinct trace triplet on the edge card for improved electrical performance.

A further object of the present invention is to provide an electrical connector for edge card applications, the connector having an electrically insulative housing with a card receiving slot extending longitudinally of the connector housing, the connector including a plurality of conductive terminals supported by the housing on opposite sides of the card-receiving slot, the terminals being arranged in "triplet", or "triad" grouping, each of which that include a pair of differential signal terminals and an associated ground terminal, the housing having a plurality of terminal-receiving cavities formed therein on opposite sides of the card-receiving slot, the terminals being arranged in said cavities in the distinct aforementioned triads, or triplets, each such grouping being separated by an intervening, empty terminal-receiving cavity such that each such terminal triad or triplet is supported by intervening space that is equivalent to two pitch or another spacing.

A still further object of the present invention is to provide a novel circuit board arrangement for use with an edge card connector, the circuit board having a plurality of conductive traces formed therein in a preselected pattern that defines a "footprint" for an edge card connector, the footprint including an imaginary longitudinal axis defining a length of the connector housing and the vias disposed on opposite sides of the interengaging axis, the vias being arranged in patterns of triplets or triads that include a pair of differential signal conductive termination traces and an associated ground termination trace which lead to like circuits on the circuit board to which the connector may be mounted, the differential signal termination traces being spaced apart from each other, and further being spaced apart from the ground termination traces, the terminations traces being arranged in a triangular pattern when viewed from above the circuit board.

A further object of the present invention is to provide a ground reference plane associated with the aforementioned circuit board, the reference plane having a plurality of large non-conductive voids, or openings formed therein, each of which encompasses two of the circuit board vias in "launch" areas of the circuit board that make up a differential signal pair of vias, and the ground reference plane is connected to a third via that forms a ground via that is associated with the differential pair signal vias, the void decreasing capacitance between the differential signal vias and the ground plane to thereby increase the impedance in the circuit board launch area.

Yet another object of the present invention is to provide an improved edge card connector that is useful in differential signal applications and which operates with a preselected range of impedances in high speed signal applications, the connector having an elongated insulative housing and a slot formed therein that extends lengthwise of the housing, the connector further including a plurality of conductive terminals that are disposed in cavities formed in the housing on opposite sides of the slot, the terminals being arranged within the cavities in a repetitive pattern of signal "A", ground, signal "B", space, signal "A", ground, signal "B", space and so forth such that plurality of distinct triplets of terminals are defined in the connector by the intervening spaces, each of the triplets including an "A" and a "B" signal terminal and an associated ground terminal, the ground terminal being flanked on both sides by an associated signal terminal, the intervening spaces reducing the capacitive coupling between adjoining triplets.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

Figure 1:
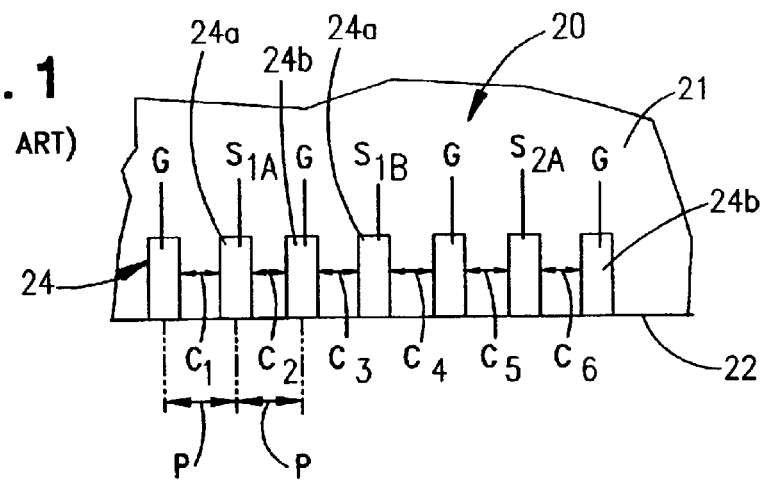
FIG. 1 is an enlarged detailed schematic diagram of the insertion edge of a conventional edge card illustrating the arrangement of conductive traces disposed therein.

The present invention is directed to an improved edge card connector that is capable of high speed performance with differential signaling at desired impedance levels.

The computer industry in constantly striving to achieve higher speeds. One proposed computer architecture is being developed which is directed to a general purpose input-output ("I/O") interconnect that can consolidate all application requirements. This proposed architecture attains a maximum boardwidth per pin using differential signaling. Differential signaling has long been used in transmission cable applications where pairs of wires carry identical, but different polarity signals, i.e., one wire carrying a +1.0 volt signal and the other wire of the pair carrying a −1.0 volt signal. In order to prevent interference with the transmission of the signals, a ground is provided in proximity to the differential signal wires in order to provide coupling between the differential wires and the ground rather than other signal wires. The two differential signal wires that make up such a pair are usually referred to in the art as a "signal channel".

Differential signal applications are not limited to cable applications using wires, but may include the use of conductive traces on circuit boards and daughter boards as well as conductive terminals supported in connector housings. Differential signal applications are used in high volume servers, work stations and personal computers ("PCs"). These components will utilize expansion cards of the edge card configurations which will require a connector to provide an interconnection between the motherboard of the device and the expansion card. As is known in the art, an edge card has a series of circuits and electrical components mounted on it and has a plurality of conductive pads disposed on one or both surfaces of the edge card along an insertion edge thereof. In order to provide the optimum interconnection in a differential signaling application, it is desirable to control, or regulate, the impedance of the interconnection to a desired level, or maintain the impedance within a desired range. One such optimum level is 100 ohms and optimum range associated with this level is a +/−10% tolerance, or a range of 90 to 110 ohms.

Conventional edge card connectors attempt to control their impedance by manipulating the sizes and shapes of the signal and ground terminals. Conventional design knowledge suggests the use of a particular signal and ground terminal arrangement, such as that described in U.S. Pat. No. 5,522,757, issued Jun. 4, 1996 and owned by the assignee of this invention in which each signal terminal is flanked with a ground terminal. Other connectors known in the art that control impedance describe the spacing of the ground terminal away from the associated pair of differential signal terminals, such as U.S. Pat. No. 6,280,209, issued Aug. 28, 2001, do not address any structural relationship of the three terminals of a differential signal transmission line in the context of an edge card connector.

The known type of arrangement used in an edge card structure and connectors therefor is illustrated in FIG. 1, where it can be seen that the edge card 20 has an elongated body portion 21 with an insertion edge 22 extending lengthwise along the card. A plurality of contact pads 24 are disposed on one, or both, exterior side surfaces of the edge card 20 and these contact pads 24 are connected to various circuits on the edge card 20 that may include conductive traces and/or electronic components. The contact pads 24 are arranged in the same pattern as the edge card connector, namely signal contact pads 24a and ground contact pads 24b. Each of these contact pads 24 are arranged in the same uniform pitch P along the edge 22 of the card 20. Because each signal contact pad 24a will carry some sort of voltage and each ground contact pad 24b will not, every set of signal and ground contact pads will act as a capacitor when energized, introducing a capacitance into the interconnection system. For each signal channel, there is a pair of differential signal contact pads S1A and S1B and three associated ground contact pads and four capacitances C1–C4 formed therebetween, as illustrated in FIG. 1. As can be seen in FIG. 1, the sequence of the edge card conductive traces, or pads, follows a G-S-G-S-G where each signal pad is flanked by two ground pads.

These above-noted capacitances, and those of all the other sets of contact pads along the card edge must be totaled together, along with the capacitances of the edge card connector terminals and the supporting mother board in order to arrive at the overall capacitance of the system. This capacitance value is the denominator of the general impedance equation referred to above and hence it tends to reduce the impedance in this area of the interconnect system. However, it is desirable to achieve and maintain a constant impedance, preferably 100 ohms +/-10% through the interconnection. It would be undesirable to reduce the impedance greatly in this edge card-terminal interface area of an edge card connector for fear of imposing a large impedance "dip', or "drop" in the overall impedance of the connector system. The present invention provides a solution to this problem.

Figure 2:
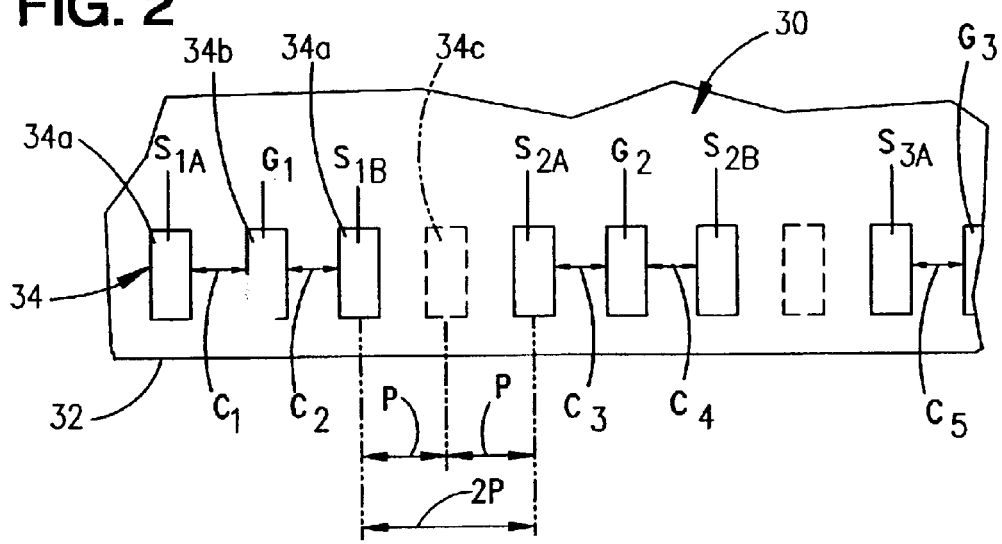
FIG. 2 is an enlarged detail schematic diagram of the insertion edge of an edge card constructed in accordance with the principles of the present invention illustrating the novel arrangement of conductive traces disposed thereon.

FIG. 2 illustrates a circuit card 30 constructed in accordance with the principles of the present invention wherein a plurality of contact pads 34 are disposed on surfaces of the edge card and spaced apart from each other along the insertion edge 32 thereof. However, we have discovered that the removal of the selected ground contact pads 34c results in an overall decrease in the system capacitance, which consequently increases the impedance of the system, especially within the distinct "triplets" or "triads" of terminals as explained below. By removing the ground contact pads 34c between distinct sets of differential signal contact pads, the contact pads of each differential signal pair, i.e., S1A and S1B; S2A and S2B will only have one ground contact pad associated therewith, i.e., G1 and G2 respectively. Thus only two capacitors are formed for each signal channel and these are shown in FIG. 2 as C1, C2 for signal pairs S1A and S1B and C3, C4 for signal pair S2A and S2B.

The contact pads 34 are kept on the same pitch and the groups of these contact pads are preferably separated by a distance equal to two pitch, or 2P as illustrated in FIG. 2. Thus, a desired pitch of the contact pads (and connector terminals) may be maintained in connector systems of the invention. The removal of these ground contact pads also serves other purposes: first, it segregates the contact pads into discrete sets of three terminals, referred to herein as terminal "triads" or "triplets", each of which includes a pair of differential signal contact pads and an associated ground contact pad. Secondly, it physically (or spatially) isolates each such signal channel triad/triplet from each other. This spatial isolation also is believed to electrically isolate the triads/triplets from each other so that any electrical affinity that the differential signal contact pads 34a (S1A, S1B) will have with any ground will largely be with the associated ground 34b (G1) and not with the signal or ground contact pads of another signal channel. Each such distinct set of three terminals, in effect, defines a differential signal transmission line at the insertion edge of the circuit card.

Figure 3:
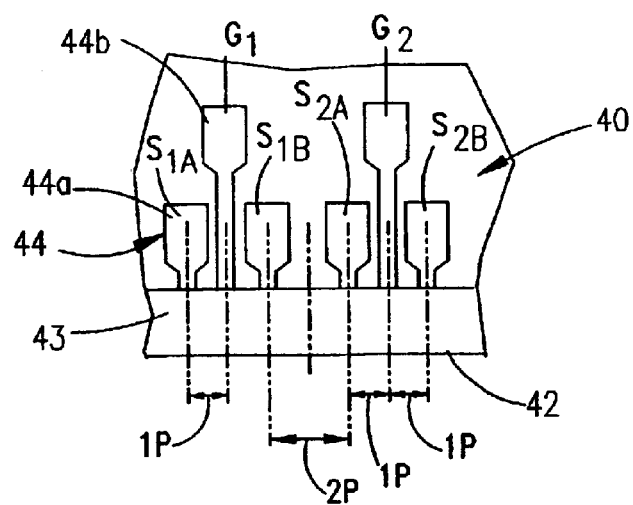
FIG. 3 is an enlarged detail schematic view of another embodiment of an edge card of the present invention.

FIG. 3 illustrates another embodiment of an edge card 40 constructed in accordance with principles of the present invention. In this embodiment, the edge card 40 has an insertion edge 42 which may be slightly beveled 43, as illustrated. In this embodiment, the contact pads 44 are arranged in triads (or triplets) with two differential signal contact pads 44a flanking an associated ground contact pad 44b. The spacing of the contact pads 44 are at a single pitch P and adjacent triads are separated from each other by a distance of greater than one pitch, preferably about two pitch, 2P and the ground contact pads 44b are disposed at a different elevation than that of the signal contact pads 44a so that there is a vertical spacing between the centers of the two different contact pads.

Figure 4:
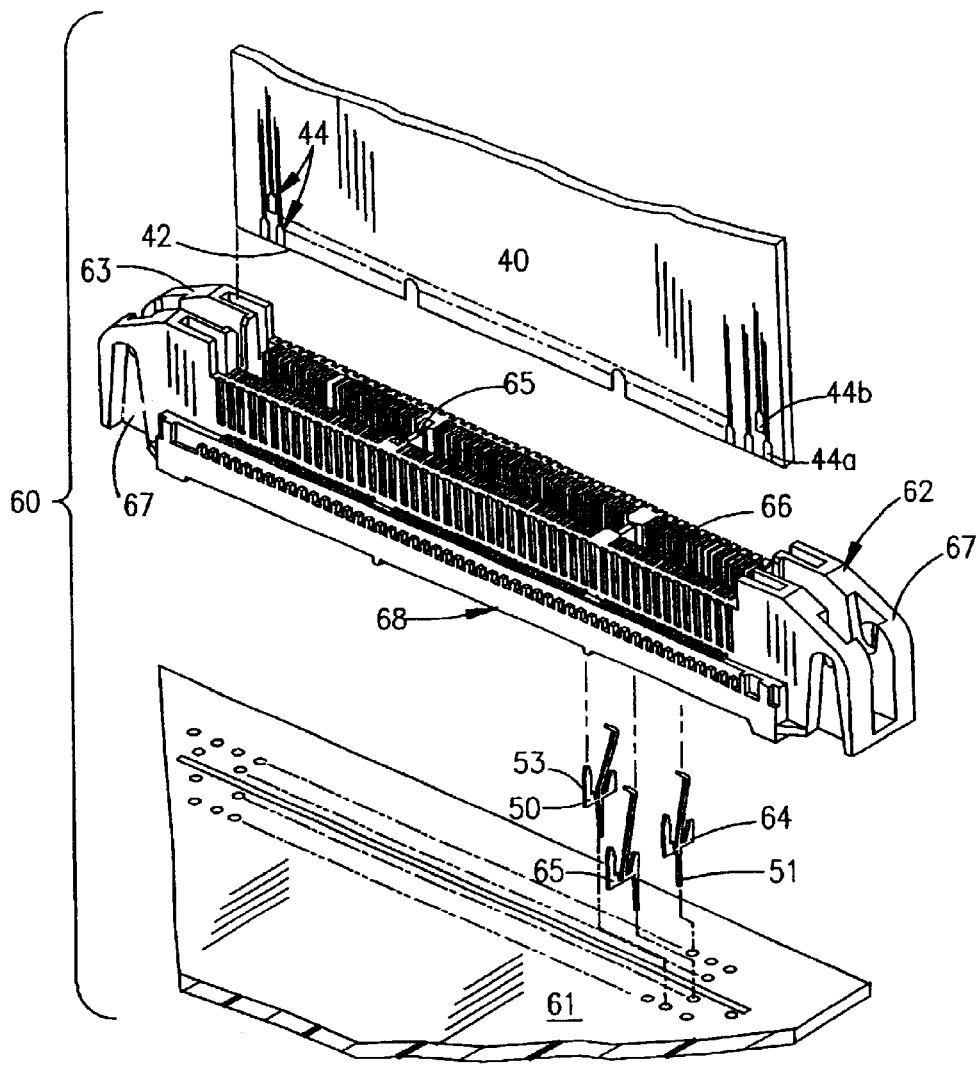
FIG. 4 is an exploded perspective view of an improved edge card connector system constructed in accordance with the principles of the present invention.

FIG. 4 illustrates an overall connector system 60 that includes a printed circuit board 61, a connector 62 and an edge card 40 of the type illustrated in FIG. 3. The connector 61 has an elongated housing 63, preferably formed from a dielectric material, such as plastic and the housing supports a plurality of conductive terminals 64, 65 therein in discrete terminal receiving cavities 66 that are disposed in the connector housing 63 on opposite sides of a card-receiving slot 66 that extends lengthwise between opposing ends 67 of the housing 63 and between two sidewall portions 68 in which the terminal-receiving cavities 66 are formed.

Figure 11:
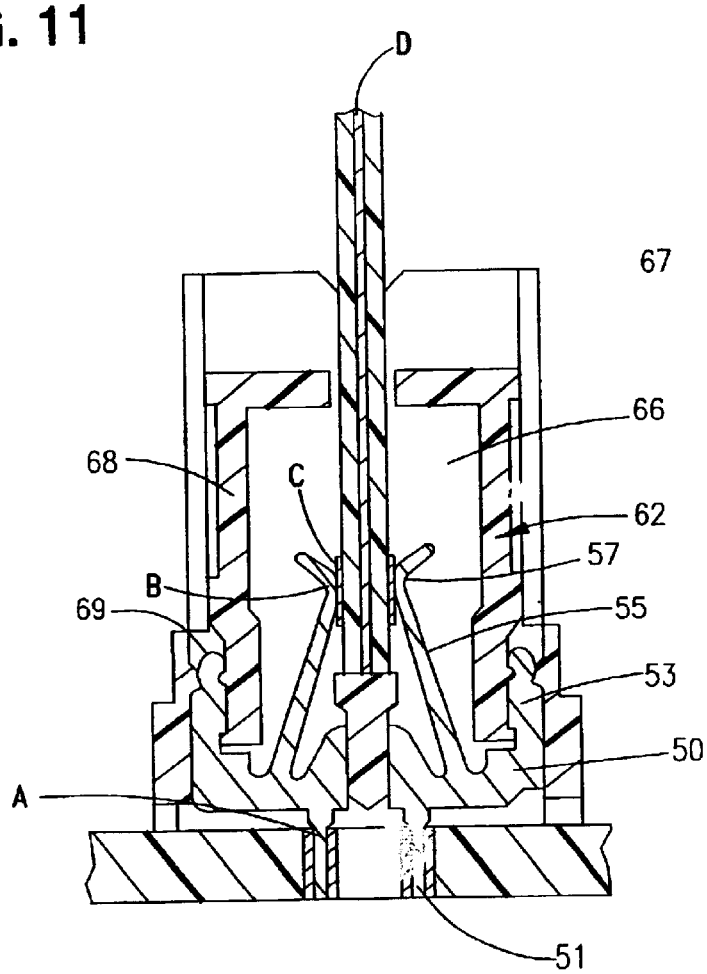
FIG. 11 is a sectional view of the connector system of FIG. 10 with the datums A–D indicated thereon.

Focusing now on the connector 62, the terminals 64, 65 may be conventional in shape and size and may differ only in their application use, i.e., either as signal or ground terminals. Each such terminal has a base portion 50 with a tail portion 51 depending therefrom. The terminals 64, 65 may also include engagement stubs 53 which, as best illustrated in FIG. 11, are received within and engage receptacles, or slots 69 of the connector housing 63. Each terminal 64, 65 preferably includes a cantilevered contact arm or beam 55 that extends out from the terminal base portion 50 at an angle therefrom and which terminates in a free end and contact portion 57 that extends partially into the connector housing card-receiving slot 66 and which deflects backwardly when an edge card is inserted whereinto as illustrated in FIG. 11. It will be understood that the terminals arrangement illustrated only as an example, and other shapes of terminals may be employed.

Figure 5:
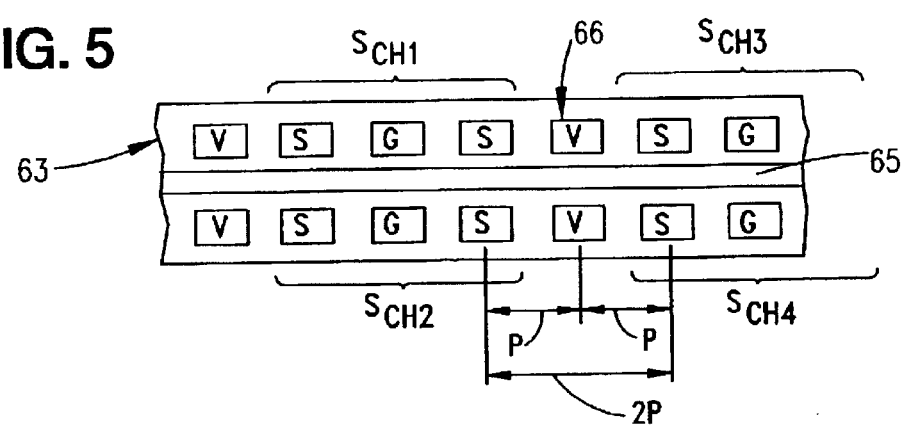
FIG. 5 is a top plan schematic view of the connector of FIG. 4 illustrating the arrangement of the terminals within the edge card connector.

In accordance with the triad/triplet concept explained above, the terminals 64, 65 are also arranged in distinct signal channel sets (or transmission lines) that are spaced apart from each other. In one embodiment, as illustrated in FIG. 5, the connector housing 63 has a full set of terminal-receiving cavities 66, but selected ones of the cavities are not filled with any terminals. These cavities are indicated as vacant by "V" in FIG. 5. Thus, each signal channel SCH1, SCH2, etc. is isolated from an adjacent signal channel by an intervening space equivalent to about two pitch, 2P. The signal channels are arranged in their unique fashion of two differential signal terminals S flanking an associated ground terminal G in order to match the pattern of the edge card contact pads. This arrangement reduces the capacitance associated with each signal channel to only two capacitances that are derived from differential signal terminals affinity to this associated ground terminal instead of the four capacitances attained if the vacant terminal-receiving cavities were filled with ground terminals. This embodiment permits the implementation of the present invention with standard connector housing in that the terminals need only be inserted in the space-signal-ground-space pattern and the intervening "V" spaces left blank. Thus, conventional connector housings may be modified to accept the terminal arrangement of the invention by selectively inserting or stitching the terminals in the novel triad S-G-S arrangements.

Figure 6:
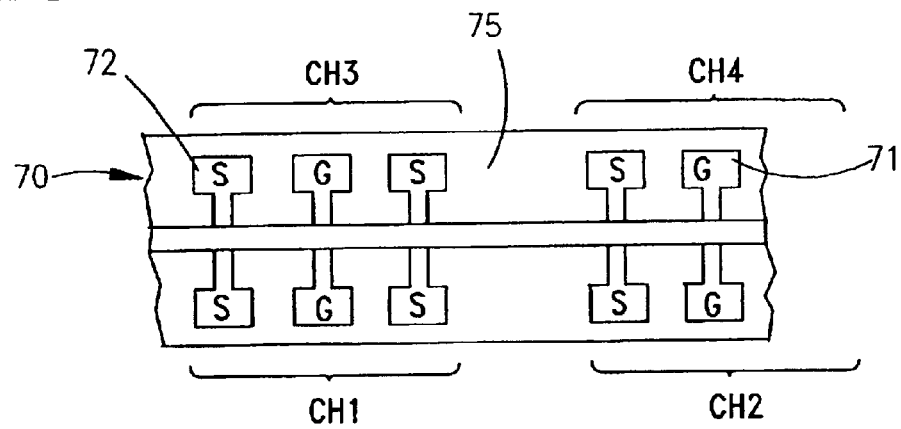
FIG. 6 is a top plan schematic view of an alternate connector in which the spacing between adjacent sets of triad terminals is molded in place in the connector housing.

FIG. 6 illustrates another embodiment of a connector constructed in accordance with the principles of the present invention. In this embodiment 70, the connector housing 71 has its terminal-receiving cavities 72 formed therein in signal channel sets of three cavities. In this type of construction, the connector housing material 75 that fills the intervening spaces between the triads/triplets assist in providing electrical isolation of the triads from each other. As mentioned above, the spacing between adjacent terminal triplets is preferably a distance of about two pitch, but the spacing may differ depending on the performance desired in the connector. Although the terminal triplets are shown in the drawings as aligned with each other on opposite sides of the card-receiving slot of the connector, it will be understood that they the triplets may be staggered with respect to each other.

Figure 7:
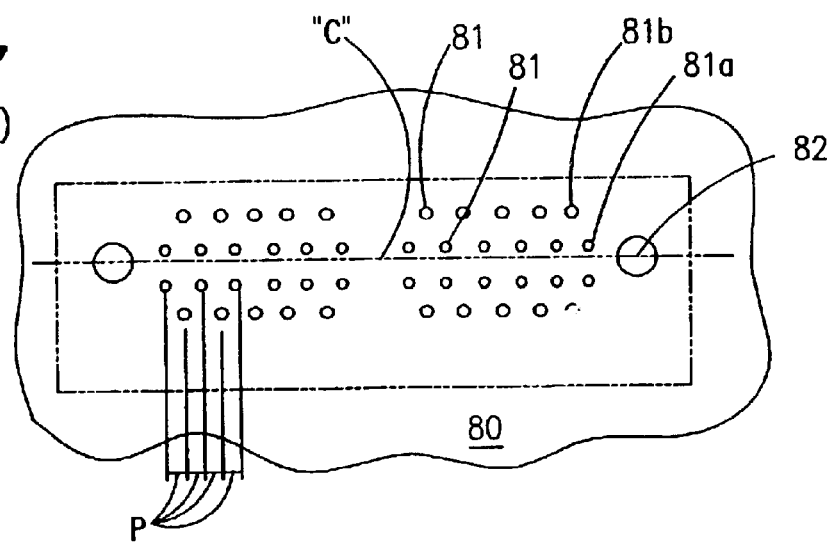
FIG. 7 is a top plan detail view of a section of a conventional circuit board illustrating the foot print in a conventional connector using a ground-signal-ground-signal-ground, etc. terminal arrangement.

The present invention also contemplates a unique circuit board (motherboard) footprint layout as compared to conventional edge card connector footprint layouts. Such a conventional layout is illustrated in FIG. 7 where the circuit board 80 has the plurality of vias 81, typically plated, and extend through the thickness of the circuit board 80 and which receive the tail portions of the terminals of the connector. The vias are arranged on opposite sides of an imaginary centerline "C" of the connector and which may serve to position mounting openings 82 of the board that receive mounting studs or pegs (not shown) of a connector. These vias are typically arranged in a one pitch P spacing on opposite sides of the centerline C. A conventional via pattern is illustrated in FIG. 7 with a typical ground-signal-ground-signal, etc. pattern with the ground vias 81a illustrated as black circles and the signal vias 81b illustrated as white circles.

This conventional arrangement tends to increase the overall capacitance of the system which in turn, lowers the system impedance. These vias tend to act as capacitors because although most of the current in such a system is carried by the terminal tail portion received in the via, a signal via still retains a voltage potential, while a ground via has no potential. A signal via with potential that is next to a ground via with no potential creates a capacitor with a capacitance. This capacitance increases the system impedance variances and makes regulation thereof difficult.

The intent of the present invention is to better control the system impedance of a high-speed differential interconnect and as such, the present invention's treatment of the circuit board is similar to that of the edge card. It eliminates a measure of capacitance that is attributable to the vias and it does so, in one aspect of the present invention, by eliminating selected vias from the circuit board. This is done in the area of the circuit (mother) board shown in FIG. 4 to which the connector is attached, and this area is known as the "launch" area, where the signals from circuits on the circuit board are "launched" into the connector and vice-versa.

Figure 8:
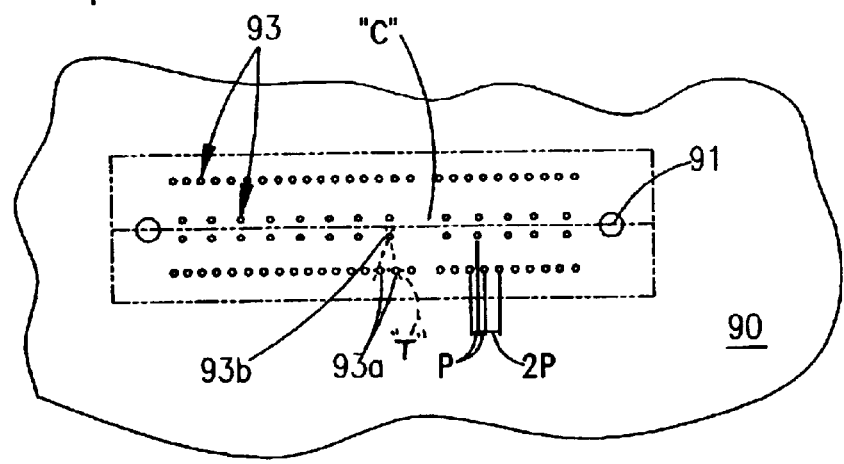
FIG. 8 is a top plan detail view of a section of a circuit board constructed in accordance with the principles of the present invention illustrating the novel signal-ground-signal triad via footprint arrangement.

FIG. 8 illustrates a circuit board 90 that incorporates a novel structure in accordance with the principles of the present invention. The circuit board 60 may include a pair of mounting openings 91 formed therein and through which an imaginary centerline "C" passes. A plurality of conductive vias 93 are formed in two rows on opposite sides of the centerline C which are adapted to receive the tails of corresponding differential signal and ground terminals (not shown). The vias, or termination traces 93, are arranged in triplet/triad sets (of three) with each such triad/triplet including a pair of differential signal vias 93a and a single associated ground via 93b. As shown in the Figures, the two differential signal vias 93a are spaced apart from each other, and preferably along a longitudinal line of alignment, and the ground via 93b is further spaced apart from the differential signal vias 93a in the transverse direction.

Although the signal and ground vias 93a, 93b are separated transversely from each other by an intervening space, each ground via 93b lies between two associated differential signal vias 93a when taken in the longitudinal direction, or parallel to the centerline "C". These three terminals are separated by a single pitch P from each other and the signal vias of one triad/triplet are separated from the signal terminals of an adjacent triad/triplet, by a larger spacing, such as the two pitch spacing 2P illustrated at the bottom right of FIG. 8. With this larger separation between triad/triplet sets, a reduction in the capacitance of the vias of the terminal sets of the system has been attained along with an increase in the impedance of the system at the vias in this "launch" area. As seen in the arrangement of the three termination vias 93a, 93b identified in the center of FIG. 8, the vias of each differential signal set are arranged in a triangular pattern, and the vias of each differential pair set, if connected by three imaginary lines, would lie at vertices of a triangle, as illustrated by "T" in FIG. 8.

Figure 9:
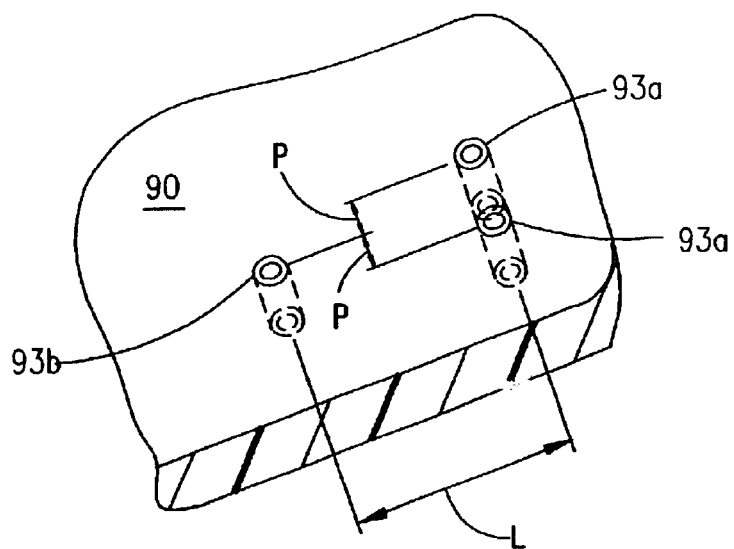
FIG. 9 is an enlarged detail partial sectional view of a portion of the circuit board of FIG. 8.

FIG. 9 illustrates the triangular relationship among the vias 93a, 93b that constitute each triple. Not only are the vias of each triad/triplet separated by a single pitch P, but they are also separated in a direction transverse to the centerline C by a distance, or spacing, L. The ground via 93b, in the same direction as L, (transverse to the connector centerline C) may be considered as lying between the two associated signal vias 93a. Increasing this distance will further enhance the capacitance reduction of this aspect of the overall system of the invention and raise the impedance of the connector system to reduce any large rises or drops in the system impedance.

Figure 12:
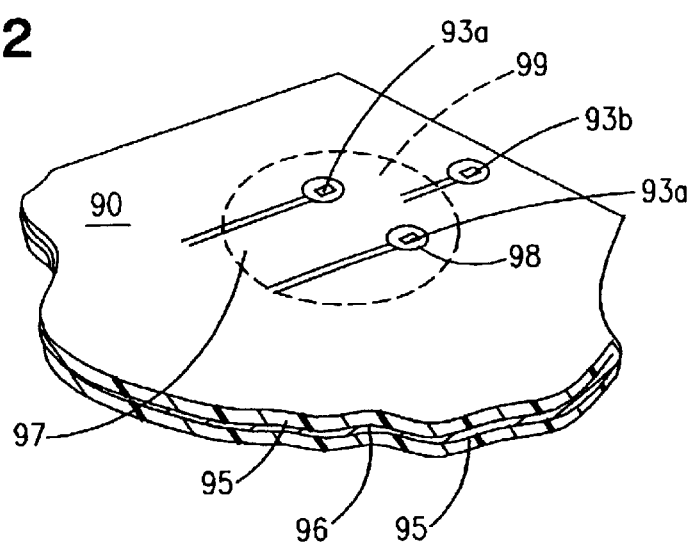
FIG. 12 is an enlarged detail sectional view, partly in section, of a circuit board segment illustrating the removal of a portion of an associated ground plane thereof; and, FIG. 13 is the same as FIG. 12, but illustrating a non-circular ground plane opening.

Additionally, while the beneficial effects of raising the impedance are achieved with the removal of the selected ground vias, it has also been discovered by us that even better impedance control may be achieved by the use of what we call "anti-pads" in the circuit board ground plane. This is illustrated in FIG. 12 where a circuit board segment 90 is illustrated and includes an internal ground, or reference plane 96 that is formed as shown in the body portion of the circuit board between two outer board layers 95, or as known in the art, may be formed on the bottom surface thereof. The ground plane 96 is formed by the use of a conductive material layer, such as a copper sheet, or deposit, and may be interposed in the body of the circuit board. Alternatively, the ground plane may be applied to a surface of the circuit board, typically the bottom surface. The board has a series of vias 93a, 93b formed therein and spaced in the unique triad/triplet pattern. Each via includes a plated area 98 associated therewith that extends through the vertical extent of the via. In the area of the signal vias 93, a portion of the ground plane is removed to form a large "anti-pad", or opening or void 99, in the ground plane 96 that encompasses at least one of the signal vias 93a, although it is depicted as preferably encompassing both signal vias in the triad/triplet. This perimeter of this anti-pad, or opening 99, encompasses the two differential signal vias of each triad, or triplet of vias in the "launch" areas of the circuit board that make up a differential signal pair of vias. The ground reference plane 96 is connected to the ground via of the triplet of vias, and thus the opening decreases capacitance between the differential signal vias and the ground via to thereby increase the impedance in the circuit board launch area.

Figure 13:
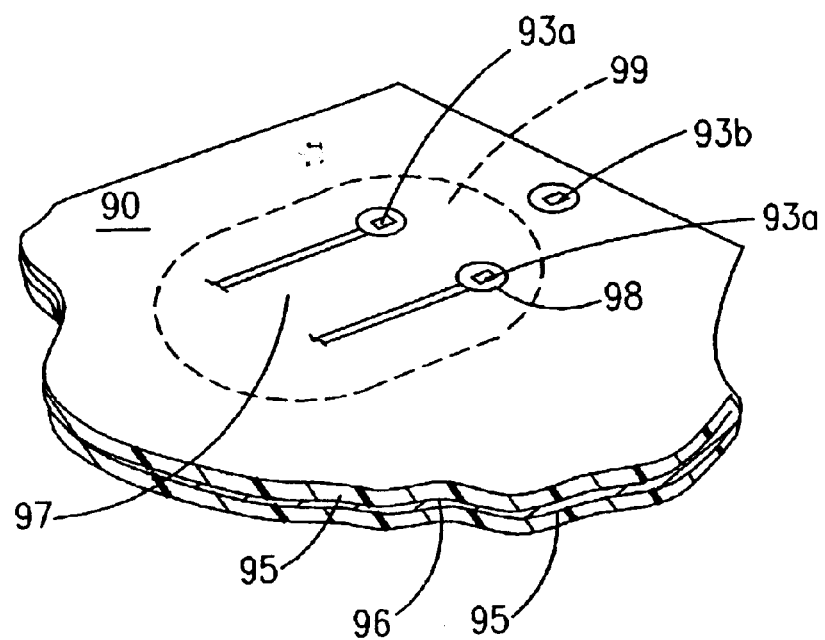

It will be understood that the shape of the opening 99 appears to be circular in FIG. 12, but it will be understood that it is not representative of a particular configuration. The shape of this cut-out, or "anti-pad", preferably takes the form of an oval or hockey rink configuration as shown in FIG. 13, which may have conventional major and minor axes associated with such ellipses and ovals. The openings may also be circular in configuration. Circuit boards of the present invention that incorporate this aspect may include anti-pads associated with each via triad/triplet.

Figure 10:
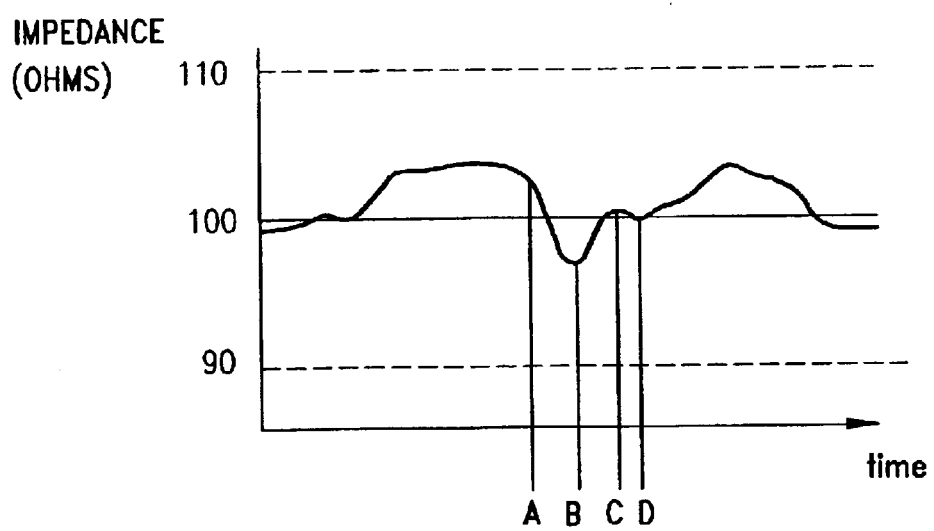
FIG. 10 in a graph plotting the impedance of an edge card connector using the signal-ground-signal triad terminal and current board system with various datums of the connector system indicated at A–D.

FIG. 10 is a TDR plot taken at a 200 picosecond risetime of the impedance profile taken through an interconnection system of the present invention, as represented in the sectional view of FIG. 11. Various datums A–D are indicated thereon which indicate as follows:

A=connector tail portions
B=connector contact arms
C=edge card contact pads
D=ground plane of edge card.

The vertical distance between the peaks and valleys (Points A & B or point C & D) of the impedance profile (as represented by the bold line in FIG. 10) is about 7 ohms and it can be seen that this system achieves a desired 100 ohm impedance +/−10%. It can be seen from this plot, how the impedance of the system is controlled by the present invention.

While the preferred embodiment of the invention have been shown and described, it will be apparent to those skilled in the art that changes and modifications may be made therein without departing from the spirit of the invention, the scope of which is defined by the appended claims.

What is claimed is:

1. An edge card connector for connecting differential circuits on an edge card to corresponding differential signal circuits on a circuit board, the edge card housing having two opposing surfaces and an insertion edge and a plurality of conductive traces disposed on at least one of the two opposing surfaces, the connector comprising:

an insulative housing having a body portion extending between two opposed ends of the housing, said housing including a card-receiving slot extending longitudinally through the housing body portion, the card-receiving slot being sized to receive at least the edge card insertion edge; and, a plurality of conductive terminals supported by said housing body portion, the terminals having contact portions for contacting the edge card conductive traces when said edge card is inserted into said card-receiving slot, the terminals being arranged in said housing in distinct triplets of terminals, each of the terminal triplets including a pair of differential signal terminals and an associated ground terminal, said terminals of each terminal triplets being spaced apart from each other at a given pitch and said terminal triplets being spaced apart from each other a distance greater than the pitch between individual terminals of said terminal triplets, so as to reduce capacitive coupling between differential signal terminals of adjacent terminal triplets and said terminal triplets are spaced apart from each other a distance that is a multiple of said pitch.

2. The connector of claim 1, wherein said terminal triplets are spaced apart from each other a distance that is approximately equal to twice said pitch.

3. The connector of claim 1, wherein for each of said terminal triplets, said associated ground terminal is interposed between said pair of differential signal terminals.

4. The connector of claim 1, wherein said terminal triplets are arranged on both sides of said card-receiving slot.

5. The connector of claim 1, wherein each of said terminals includes a tail portion for terminating to a circuit board, a contact portion for contacting an opposing conductive trace of said edge card and a body portion interconnecting the terminal contact and tail portions together.

6. The connector of claim 5, wherein said differential signal terminal tail portions are spaced apart from each other in a longitudinal direction and are further spaced apart from said associated ground terminal tail portion in a transverse direction.

7. The connector of claim 6, wherein an imaginary line drawn through said associated ground terminal tail portion transversely to said card-receiving slot passes between said differential signal terminal tail portions.

8. The connector of claim 5, wherein said terminal contact portions of said ground terminal of each terminal triplet is disposed at an elevation different than the differential signal contact portion of said terminal triplet.

9. The connector of claim 1, wherein said housing body portion includes a plurality of terminal-receiving cavities and each of said terminals is received within a single cavity.

10. The connector of claim 9, wherein said housing body portion includes at least one empty terminal-receiving cavity interposed between each of said terminal triplets.

11. The connector of claim 9, wherein the terminal-receiving cavities are arranged in distinct sets of three in said housing body portion, and each set of three cavities are spaced apart from each other a distance greater than any distance separating two adjacent terminals in any of said terminal sets.

12. The connector of claim 9, wherein said terminal-receiving cavities are arranged on both sides of said card-receiving slot.

13. An edge card connector for connecting differential circuits on an edge card to corresponding differential signal circuits on a circuit board, the edge card housing having two opposing surfaces and an insertion edge and a plurality of conductive traces disposed on at least one of the two opposing surfaces, the connector comprising:

an insulative housing having a body portion extending between two opposed ends of the housing, said housing including a card-receiving slot extending longitudinally through the housing body portion, the card-receiving slot being sized to receive at least the edge card insertion edge; and, a plurality of conductive terminals supported by said housing body portion, the terminals having contact portions for contacting the edge card conductive traces when said edge card is inserted into said card-receiving slot, the terminals being arranged in said housing in distinct triplets of terminals, each of the terminal triplets including a pair of differential signal terminals and an associated ground terminal interposed between the pair of differential signal terminals, said terminal of said terminal triplets being spaced apart from each other a first distance, and said terminal triplets being spaced apart from each other a second distance that is greater than the first distance between individual terminals of said terminal triplets, so as to reduce capacitive coupling between differential signal terminals of adjacent terminal triplets.

14. A circuit board having an area of controlled impedance defined in a mating area that mates with a differential signal edge card connector, the edge card connector including a plurality of conductive pins extending therefrom for mating with conductive traces on the circuit board, the connector conductive pins being arranged in distinct sets of three conductive pins, each set including a pair of differential signal conductive pins and a ground conductive pin associated with the pair of differential signal conductive pins, the three conductive pins cooperatively defining a triplet of mating pins, said circuit board comprising;

a pair of differential signal conductive traces and a single ground conductive trace associated therewith, the ground and differential signal conductive traces cooperatively defining a triplet of conductive traces for mating with a triplet of mating pins of said connector, said differential signal conductive traces being spaced apart from each other in a first direction and said single ground conductive trace of said trace triplet being spaced apart from said differential signal pair of conductive traces in a second direction, different from said first direction and angularly offset therefrom, such that said differential signal pair and ground conductive traces lie at in a triangular arrangement with said traces lying at respective vertices of an imaginary triangle and said circuit board further including a conductive reference plane spaced apart from said conductive traces, said reference plane including at least one opening formed therein, the reference plane one opening being aligned with said differential signal pair of conductive traces such said differential signal pair of conductive traces of said trace triplet are encompassed within a perimeter of said opening.

15. The circuit board of claim 14, wherein said conductive traces include conductive vias extending through said circuit board.

16. The circuit board of claim 14, wherein said reference plane opening is a circular opening.

17. The circuit board of claim 14, wherein said reference plane opening is a non-circular opening.

18. The circuit board of claim 14, wherein said ground conductive trace is connected to said reference plane.

19. The circuit board of claim 14, further including a plurality of circuit board trace triplets arranged longitudinally in a position on opposite sides of an imaginary center line of the pattern.

20. The circuit board of claim 19, wherein each of said non-conductive openings has a circular configuration.

21. The circuit board of claim 19, further including a conductive reference plane associated within said circuit board, the conductive reference plane including a plurality of non-conductive openings formed therein, each of the non-conductive openings being associated and aligned with one of said circuit board triplets such that said differential signal pair of conductive traces lie within a perimeter of an associated one of said non-conductive openings.

22. The circuit board of claim 21, wherein each of said conductive traces includes a plated via extending through said circuit board, and said ground via contacts said reference plane.

23. A contact pad arrangement for an edge card used in high speed signal applications, the edge card supporting a plurality of distinct differential signal circuits and ground circuits, said edge card further including an insertion edge for inserting said edge card into a connector, said circuits terminating in respective differential signal and ground contact pads, comprising:

said contact pads being arranged in triplets disposed proximate to said insertion edge, each of the contact pad triplets including a pair of differential signal contact pads and a single ground contact pad, the ground contact pad of each contact pad triplet being interposed between said differential signal contact pads, said contact pads of each of said contact pad triplet being spaced apart from each other a first distance and said contact pad triplets being spaced apart from each other a second distance that is greater than said first distance, so as to reduce capacitive coupling between differential signal contact pads of adjacent contact pad triplets.

24. The edge card of claim 23, wherein for each contact pad triplets, said ground contact pad is spaced apart from said its two associated differential signal contact pads a third distance.

25. A circuit board having an area of controlled impedance defined in a mating area that mates with a differential signal edge card connector, the edge card connector including a plurality of conductive pins extending therefrom for mating with conductive traces on the circuit board, the connector conductive pins being arranged in distinct sets of three conductive pins, each set including a pair of differential signal conductive pins and a ground conductive pin associated with the pair of differential signal conductive pins, the three conductive pins cooperatively defining a triplet of mating pins, said circuit board comprising;

a pair of differential signal conductive vias and a single ground via formed in the circuit board, the ground and differential signal conductive vias cooperatively defining a triplet of conductive vias for mating with a triplet of mating pins of said connector, said differential signal conductive traces being spaced apart from each other in a first direction and said single ground conductive via of said trace triplet being spaced apart from said differential signal pair of conductive vias in a second direction that is different from said first direction, said circuit board further including a conductive reference plane spaced apart from a surface of said circuit board, the reference plane including at least one non-conductive opening formed therein, the reference plane one non-conductive opening being aligned with said differential signal pair of conductive vias such said differential signal pair of conductive vias of said trace triplet are encompassed within a perimeter of said opening.

26. The circuit board of claim 25, wherein each of said vias is plated with a conductive material and extends through said circuit board, and said ground via contacts said reference plane.

27. The circuit board of claim 25, wherein said non-conductive opening has a circular configuration.

28. The circuit board of claim 25, wherein said non-conductive opening has a circular configuration.

29. An edge card connector for connecting differential circuits on an edge card to corresponding differential signal circuits on a circuit board, the edge card housing having two opposing surfaces and an insertion edge and a plurality of conductive traces disposed on at least one of the two opposing surfaces, the connector comprising:

an insulative housing having a body portion extending between two opposed ends of the housing, said housing including a card-receiving slot extending longitudinally through the housing body portion, the card-receiving slot being sized to receive at least the edge 4card insertion edge, said housing further including a plurality of terminal-receiving cavities; and, a plurality of conductive terminals supported by said housing body portion, the terminals having contact portions for contacting the edge card conductive traces when said edge card is inserted into said card-receiving slot, single terminals being received in single terminal-receiving cavities, said terminals being arranged in said housing in distinct triplets of terminals, each of the terminal triplets including a pair of differential signal terminals and an associated ground terminal, said terminals of said terminal triplets being spaced apart from each other at a given pitch and each of said terminal triplets being spaced apart from an adjacent terminal triplet by at least one empty terminal-receiving cavity interposed therebetween.

* * * * *